(12) United States Patent
Lee

(10) Patent No.: US 6,372,564 B1
(45) Date of Patent: Apr. 16, 2002

(54) METHOD OF MANUFACTURING V-SHAPED FLASH MEMORY

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/538,998

(22) Filed: Mar. 30, 2000

(30) Foreign Application Priority Data

Mar. 21, 2000 (TW) .......................................... 89105151

(51) Int. Cl.⁷ ............................................. H01L 21/337
(52) U.S. Cl. ...................... 438/192; 438/257; 438/258; 438/259; 437/43
(58) Field of Search ................................. 438/192, 257, 438/258, 259; 437/43

(56) References Cited

U.S. PATENT DOCUMENTS

| 4,085,603 A | * | 4/1978 | Vanek ............................ 72/41 |
| 5,569,615 A | * | 10/1996 | Yamazaki et al. ............. 437/43 |
| 5,587,332 A | * | 12/1996 | Chang et al. .................. 437/43 |
| 5,953,610 A | * | 9/1999 | Takeuchi ..................... 438/258 |
| 6,087,220 A | * | 7/2000 | Rogers et al. ............... 438/257 |
| 6,096,604 A | * | 8/2000 | Cha et al. .................... 438/259 |

\* cited by examiner

*Primary Examiner*—Richard Elms
*Assistant Examiner*—Pho Luu
(74) *Attorney, Agent, or Firm*—Jiawei Huang; J.C. Patents

(57) ABSTRACT

A method of manufacturing a V-shaped flash memory. The V-shaped stack gate is formed by implanting ions into a substrate to form a buried source line using a mask, and then forming a V-shaped trench that exposes the buried source line in the substrate. A V-shaped word line stack gate is next formed over the trench and the substrate next to the trench. A common drain terminal is formed in the substrate on each side of the V-shaped stack gate. The drain terminal is electrically connected to a bit line by forming a contact plug.

18 Claims, 4 Drawing Sheets

METHOD OF MANUFACTURING V-SHAPED FLASH MEMORY

CROSS-REFERENCE TO RELATED APPLICATION

This application claims the priority benefit of Taiwan application serial no. 89105151, filed March 21, 2000.

BACKGROUND OF THE INVENTION

1. Field of Invention

The present invention relates to a method of manufacturing semiconductor device. More particularly, the present invention relates to a method of forming V-shaped flash memory such that level of integration for the memory is increased.

2. Description of Related Art

Conventional non-volatile memory can be divided into several types including erasable programmable read only memory (EPROM), electrical erasable programmable read only memory (EEPROM) and flash memory. Because input data are retained when power is turned off, they are ideal storage media for operational programs.

In general, a flash memory unit includes a floating gate for storing electric charges and a control gate for controlling the access of data. The floating gate is formed in the space within the control gate. The floating gate is normally in a floating state because the gate is not connected to any external circuit. On the other hand, the control gate is electrically connected to a word line and the drain terminal of a flash memory unit is electrically connected to a bit line.

To program data into a flash memory unit, electrons are injected into the floating gate unit near the drain terminal through a channel hot electron injection (CHEI). To erase data from a flash memory unit, electrons in the floating gate are channeled away via a source terminal through Fowler-Nordheim (FN) tunneling. For a flash memory unit having a conventional N-type ETOX structure, injection probability in a CHEI operation is only about $10^{-9}$. Hence, a higher voltage must be applied resulting in greater energy consumption and lower programming efficiency.

In addition, due to an increase in the level of integration, dimensions of each device in a silicon chip will decrease according to the design rules. Consequently, operating voltage of a device is also lowered correspondingly. Since a large coupling between the floating gate and the control gate will lower the voltage needed to operate a memory transistor, it is beneficial to increase the capacitance between a floating gate and a control gate.

There are three methods of increasing capacitor coupling between a floating gate and a control gate. They includes increasing the overlapping area between the floating gate and the control gate, decreasing the thickness of dielectric layer between the floating gate and the control gate and increasing the dielectric constant k of the dielectric layer. However, the dielectric layer between the floating gate and the control gate must have sufficient thickness to prevent trapped electrons in the floating gate from jumping into the control gate leading to device failure. On the other hand, increasing dielectric constant of the dielectric layer is not a simple task because it involves materials and techniques that are closely related to processing equipment.

SUMMARY OF THE INVENTION

Accordingly, one object of the present invention is to provide a V-shaped flash memory structure capable of increasing the level of integration as well as efficiency in programming and erasing. Furthermore, through an increase in the overlapping area between the floating gate and the control gate in each flash memory cell, capacitor coupling is increased and operating voltage is lowered.

To achieve these and other advantages and in accordance with the purpose of the invention, as embodied and broadly described herein, the invention provides a method of forming a V-shaped flash memory unit. A substrate is first provided, and then a mask layer is formed over the substrate. Using the mask layer as an implant mask, the substrate is doped to form a buried source line in the substrate. The substrate is next etched using the mask layer as an etching mask to form a V-shaped trench that exposes the buried source line. The mask layer is removed. A V-shaped word line stack gate is formed over the V-shaped trench and extends into regions above the substrate on each side. The V-shaped word line stack gate includes a tunnel oxide layer, a floating gate, a dielectric layer and a control gate. A common drain region is formed in the substrate on each side of the V-shaped stack gate. An insulation layer is formed over the substrate, and then a bit line is formed over the insulation layer. A conductive plug is formed in the insulation layer and electrically connects the common drain region and the bit line.

The V-shaped structure of this invention increases the level of integration of flash memory and the overlapping area between the floating gate and the control gate. Hence, capacitor coupling is increased and operating voltage is lowered. In addition, the provision of two channels in the V-shaped structure increases programming and erasing efficiency of each flash memory unit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
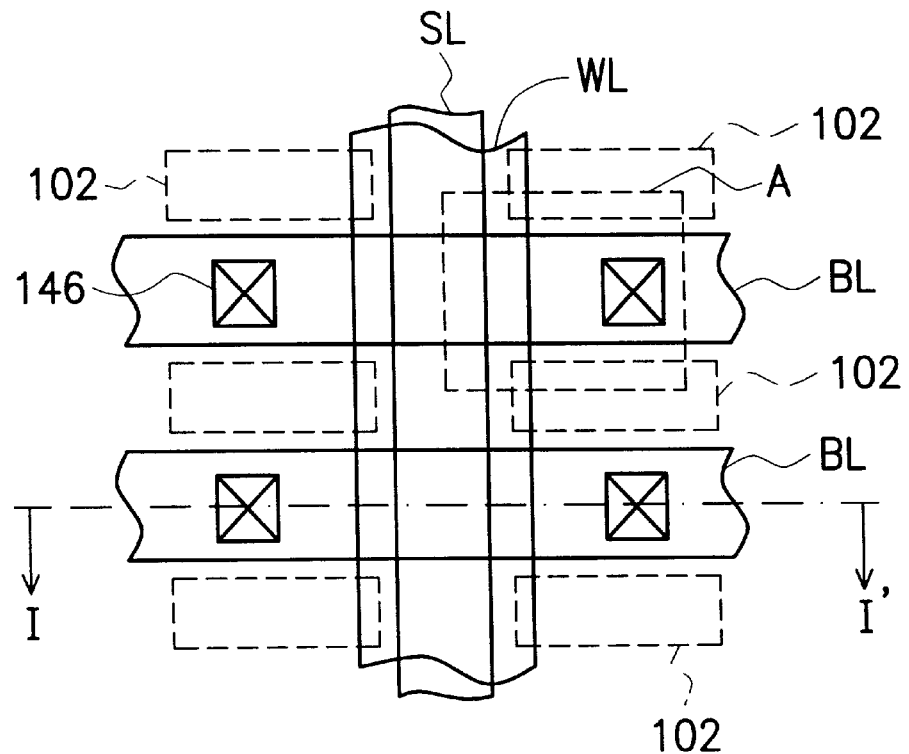
FIG. 1 is a schematic top view showing the layout of a flash memory unit according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic top view showing the layout of a flash memory unit according to one preferred embodiment of this invention. As shown in FIG. 1, a plurality of longitudinal device isolation structures 102 such as field oxide or shallow trench isolation (STI) is formed in a semiconductor substrate 100. The device isolation structures 102 provide the necessary isolation between adjacent flash memory cells. A source line SL is embedded within the substrate 100 (FIG. 2A) and connected to a column address register at the peripheral region of the memory cell array. The V-shaped word line stack gate WL structure is formed above the buried source line SL. The word line stack gate WL is also connected to the column address register at the peripheral region of the memory cell array. A bit line BL is electrically connected to the drain region (location of the contact plug 146) in the substrate 100 on each side of word line WL via a contact plug 146. The bit line BL runs in a direction vertical to the word line stack gate WL and the buried source line SL. The bit line BL is electrically connected to a row address register at the peripheral region of the memory cell array. Through proper selection of word line WL, source line SL and bit line BL, a particular memory cell (the memory cell in area A) may be selected for programming, reading or data erasure.

Since the buried source line SL is formed beneath the word line WL, some layout area for the source line is saved. Because each flash memory unit in this invention has a smaller dimension than the flash memory unit in a conventional flash memory layout, overall level of integration of the flash memory is greatly increased.

FIGS. 2A through 2F are schematic cross-sectional views along line I-I' of FIG. 1 showing the progression of steps for producing the flash memory unit according to this invention.

Figure 2A:
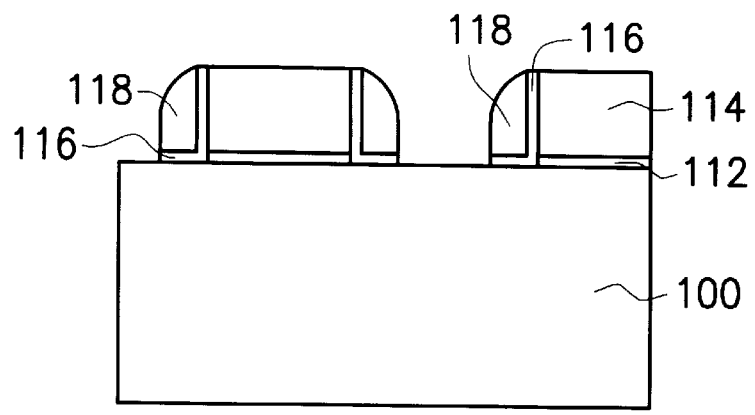
FIGS. 2A through 2F are schematic cross-sectional views along line I-I' of FIG. 1 showing the progression of steps for producing the flash memory unit according to this invention.

First, as shown in FIG. 2A, a substrate 100 is provided. Device isolation structures 102, for example, field oxide (FOX) layers or shallow trench isolation (STI) structures are formed in the substrate 100. A hard mask layer 114 and mask spacers 118 are formed over the substrate 100. The hard mask layer 114 and the mask spacers 118 can be formed using silicon nitride, for example. In addition, a buffer layer 112 is formed in the space between the hard mask layer 114 and the substrate 100 while another buffer layer 116 is formed between the mask spacer 118 and the hard mask layer 114. These buffer layers 112 and 116 lower the stress between the hard mask layer 114 and the mask spacers 118. The hard mask layer 114, the mask spacers 118 together with the buffers 112 and 116 are formed by sequentially depositing silicon oxide and silicon nitride over the substrate 100 to form a silicon oxide and a silicon nitride layer. Through conventional photolithographic and etching processes, the oxide layer and nitride layer are patterned to form the buffer layer 112 and the hard mask layer 114. A conformal silicon oxide layer and a silicon nitride layer are next formed over the substrate 100. Finally, the conformal oxide layer and the conformal nitride layer are sequentially etched to form the buffer 116 and the mask spacers 118.

Figure 2B:
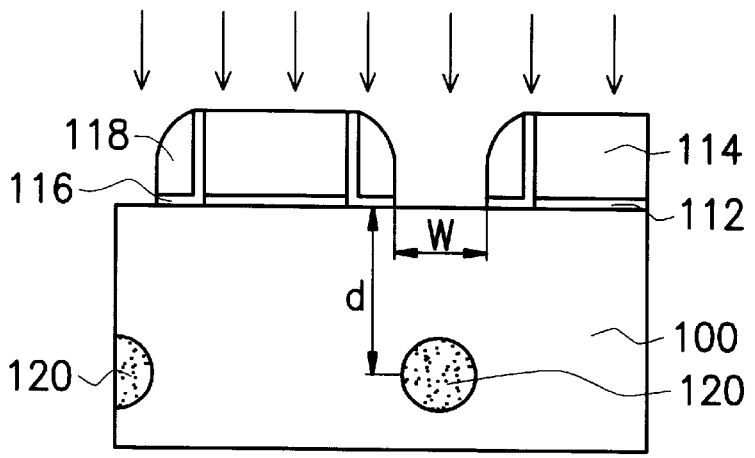

As shown in FIG. 2B, an ion implantation is conducted implanting ions into the substrate 100 to form a buried source line 120 while using the hard mask layer 114 and the mask spacers 118 as a mask. Depth of the buried source line 120 can be adjusted according to the dimensions of the desired flash memory unit. For example, if the width of separation w between two neighboring mask spacers 118 is 0.15 $\mu$m, implanted depth of the source line 120 should be between 0.2 to 0.4 $\mu$m.

Figure 2C:
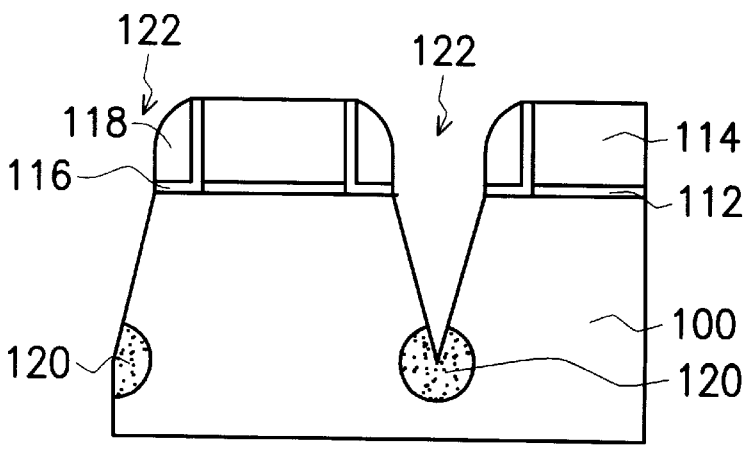

As shown in FIG. 2C, using the hard mask layer 114 and the mask spacers 118 as a mask, V-shaped trench 122 is formed in the substrate 100. A slant-etching technique, for example, is used to etch the substrate 100 such that the bottom section of the V-shaped trench 122 is ultimately in contact with the source line 120. The bottom section of the V-shaped trench may be flattened somewhat due to local processing conditions. However, a flattening of the trench bottom is unlikely to have any serious effect on the structure or performance of the flash memory.

Figure 2D:
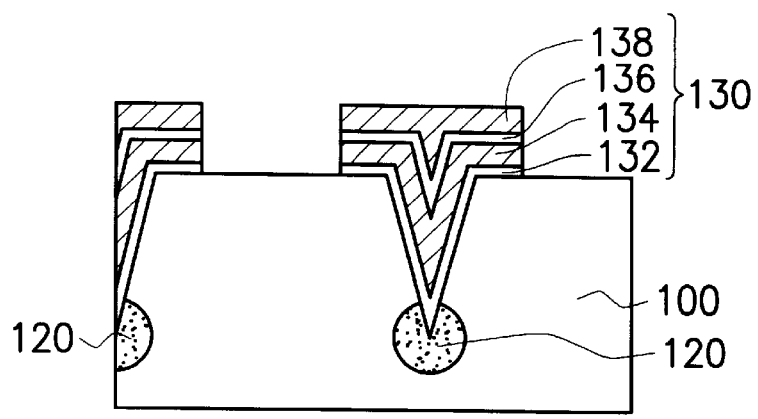

As shown in FIG. 2D, the hard mask layer 114, the mask spacers 118 and the buffer layer 112 and 116 are removed. If the mask layers are nitride layers and the buffer layers are oxide layers, the nitride layers are removed by phosphoric acid ($H_3PO_4$) solution while the oxide layers are removed by diluted hydrogen fluoride (HF) solution.

A V-shaped word line stack gate structure 130 is formed above the V-shaped trench 122. The word line stack gate 130 includes a tunnel oxide layer 132, a floating gate 134, a dielectric layer 136 and a control gate 138. Since a conventional word line stack is directly formed over the substrate, no V-shaped structure is formed. The lower portion of the stack gate structure 130 has a V-shaped profile because a V-shaped trench 122 is formed in a previous step.

The stack gate structure 130 is formed in a manner very similar to the fabrication of the stack gate of a conventional ETOX flash memory. For example, a conformal silicon oxide layer and a conformal doped polysilicon layer are sequentially formed over the substrate 100 to serve as the tunnel oxide layer 132 and the floating gate 134. Conventional photolithographic and etching techniques are next used to pattern the oxide layer and the doped polysilicon layer. Hence, a plurality of parallel conductive lines perpendicular to the buried source line 120 (buried source line SL in FIG. 1) is formed in the active region between the device isolation structures 102. A thin conformal dielectric layer such as an oxide-nitride-oxide (ONO) layer is formed over the doped polysilicon layer, and then another doped polysilicon layer is formed over the dielectric layer. The ONO layer serves as the dielectric layer 136 while the second doped polysilicon layer serves as the control gate 138. Finally, the stack of layers is patterned to form a plurality of parallel word lines 130 above the buried source lines 120. The tunnel oxide layer 132 and the floating gate 134 are formed above the active region of each memory unit. On the other hand, the dielectric layer 136 and the control gate 138 are connected in series with the tunnel oxide layer 112 and floating gate 114 above the buried source line 120.

Figure 2E:
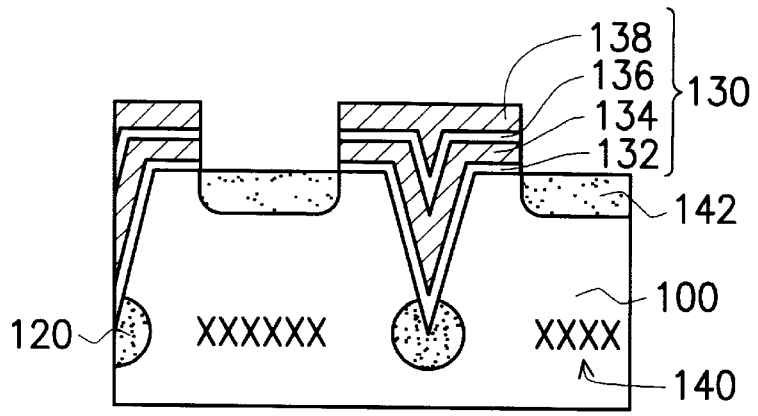

As shown in FIG. 2E, an anti-punchthrough implant is carried out, implanting ions into the substrate 100 between adjacent stack gates 130 to form an anti-punchthrough dopant region 140. Depth of implant is roughly at the same level as the buried source line 120. However, the implanted dopants should have a polarity just opposite to the dopants inside the buried source line 120. For example, if the implanted dopants inside the buried source line are N-type (such as phosphorus or arsenic), the implanted dopants inside the anti-punchthrough dopant region 140 should be P-type (such as boron). Similarly, another ion implantation is conducted, implanting dopants having polarity type similar to the one in the source line into substrate between adjacent stack gates 130 to form a common drain region 142.

Figure 2F:
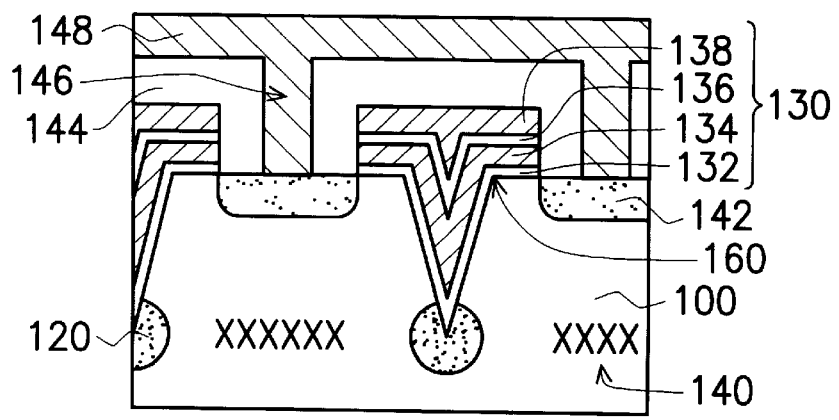

As shown in FIG. 2F, an insulation layer 144 such as a silicon oxide layer is formed over the substrate 100. The insulation layer can be a silicon oxide layer formed, for example, in a chemical vapor deposition using tetra-ethyl-ortho-silicate (TEOS). A chemical-mechanical polishing is next carried out to planarize the insulation layer 144. Contact plugs 146 that connect electrically to the drain region 142 are formed in the insulation layer 144. A plurality of parallel bit lines 148 is formed over the insulation layers 144 for linking up rows of contact plugs 146. The bit lines 148 run in a direction perpendicular to the stack gates 130. The contact plug 146 is formed by performing photolithographic and etching operation to form a contact opening in the insulation layer 144, and then depositing conductive material into the opening to form the contact plug 146. Conductive material for filling the opening includes sputtered tungsten (W) or aluminum (Al). Alternatively, the conductive material can be doped polysilicon formed by chemical vapor deposition. The bit lines 148 are formed by conventional photolithographic and etching techniques.

Figure 3:
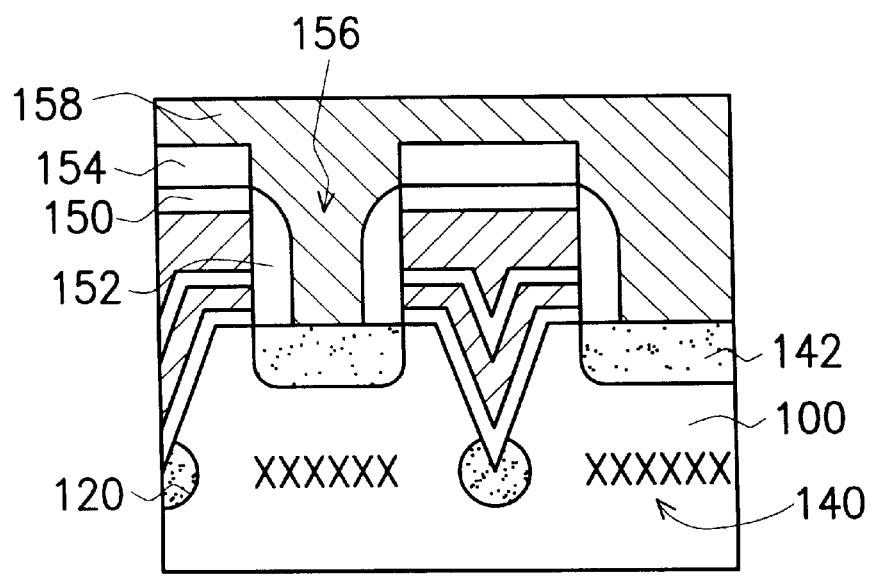
FIG. 3 is a cross-sectional view related to FIG. 2F showing how sidewall spacers are used to increase the width of a word line contact plug.

FIG. 3 is a cross-sectional view related to FIG. 2F showing how sidewall spacers are used to increase the width of a word line contact plug. Beside using the aforementioned method of forming the contact plug 146, a cap layer 150 and sidewall spacers 152 can be used to form a contact plug 156 that has a larger process window. The method includes forming a cap layer 150 such as a silicon nitride layer over the stack gates 130, and then forming spacers 152 on the sidewalls of the word line stack gates 130 and the cap layer 150. An insulation layer 154 is formed over the substrate 100. Contact openings are formed in the insulation layer 154 by conventional photolithographic and etching techniques. Conductive material is deposited into the contact opening to form the contact plug, and then a bit line is formed over the contact plug. The etching step for forming the contact window is a self-aligned process due to the presence of an etch-resistant cap layer 150 and sidewall spacers 152. Since a wider photoresist opening can be used in a self-aligned process, processing window of the contact plug is increased.

Figure 4:
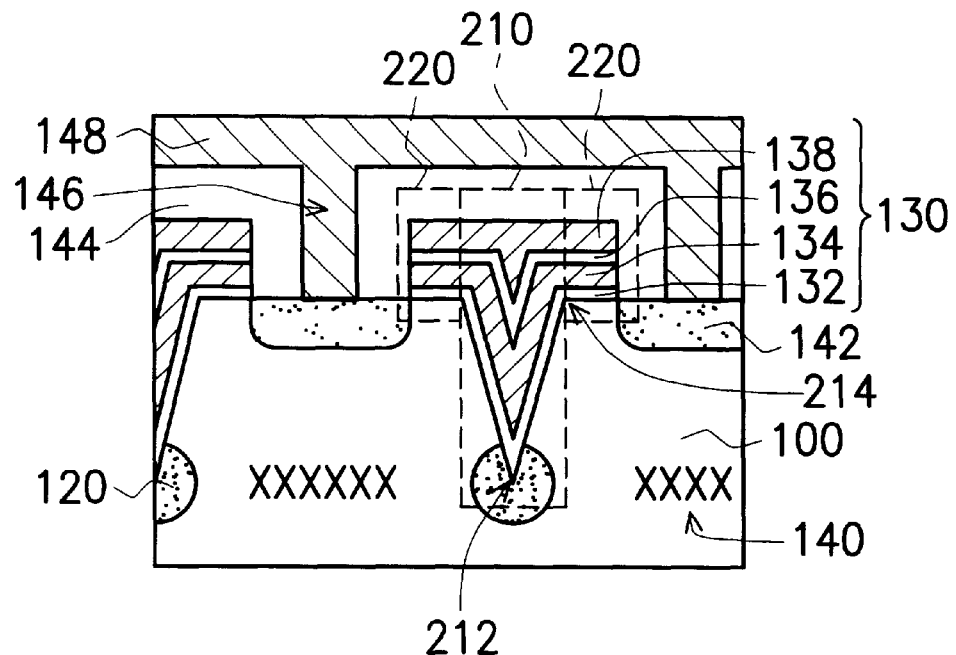
FIG. 4 is a cross-sectional view showing the flash memory structure according to this invention.

FIG. 4 is a cross-sectional view showing the flash memory structure according to this invention. As shown in FIG. 4, the components of a flash memory cell includes a V-shaped word line stack gate structure 130, a source line 120 near the tip section of the V-shaped structure, and a common drain 142 between two adjacent V-shaped word line stack gates 130. The V-shaped word line stack gate 130 includes a V-shaped wedge section 210 buried within the substrate 100 and connected to the buried source line 120. In other words, the tip 212 at the bottom of the V-shaped wedge section 210 is enclosed by a portion of the buried source line 120. In addition, a wing 220 is formed above the substrate 100 extending from a corner region 214 on each side of the V-shaped wedge section 210. The common drain terminal 142 is formed in the substrate 100 on each side of the stack gate 130 next to its neighboring word line stack gate 130.

Since the word line stack gate 130 is formed from a tunnel oxide layer 132, a floating gate 134, a dielectric layer 136 and a control gate 138, the tunnel oxide layer 132 has a portion of V-shaped wedge section 210 buried within the substrate 100 and connected with the buried source line 120. In other words, the tip 212 of the V-shaped wedge section 210 is enclosed by the buried source line 120. Moreover, the V-shaped wedge section 210 has two side wings 220 each extending from the corner regions 214 on each side of the V-shaped wedge section 210. The floating gate layer 134 is above the tunnel oxide layer 132 conformal to the underlying tunnel oxide layer 132. Similarly, the floating gate layer 134 also has a V-shaped wedge section 210 and side wings 220. The dielectric layer 136 is above the floating gate 134 and conformal to the underlying floating gate 134.

The word line stack gate of a conventional ETOX flash memory is laid horizontally over the substrate. For such a layout, overlapping area between a floating gate and its overlying control gate depends on the surface area of the floating gate. Since coupling capacitance depends on the effective surface area of a capacitor, coupling of flash memory cell will be reduced following any reduction in the dimension of the flash memory unit.

The flash memory cell of this invention has a V-shaped word line stack gate structure buried within a substrate. Through bending in the vertical direction, overlapping area between the floating gate and the control gate is increased, and the operating voltage of the stack gate is lowered. In fact, the overlapping area between the floating gate and the control gate in this invention is more than twice that of a conventional ETOX flash memory. Moreover, by forming a buried bit line directly under the word line stack gate, layout area for source line is greatly reduced. Hence, the level of integration for flash memory having this V-shaped stack gate structure is increased.

Figure 5:
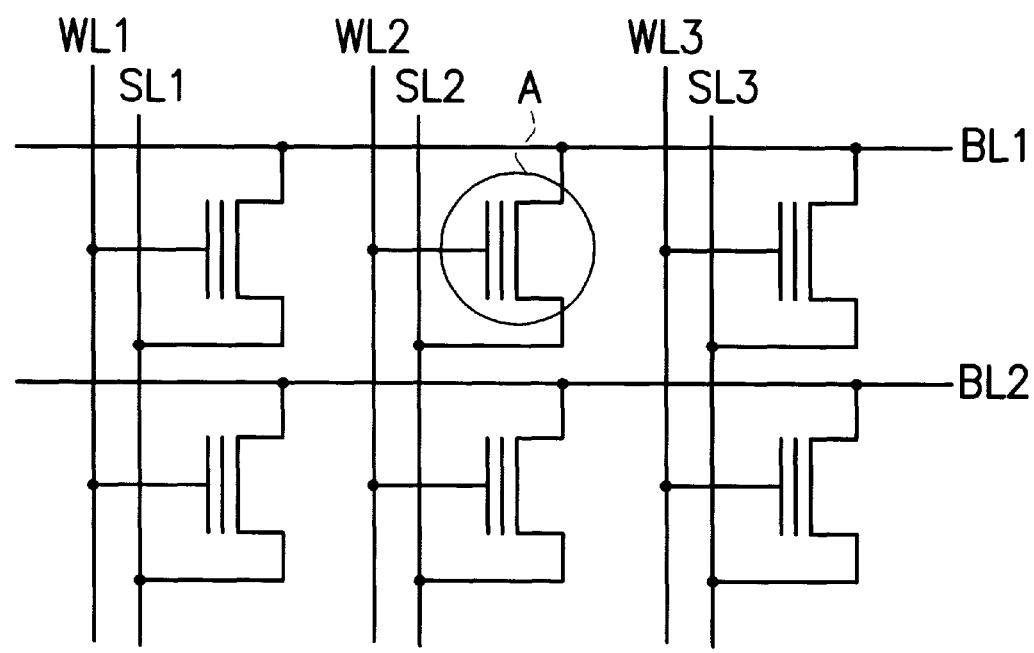
FIG. 5 is an equivalent circuit diagram of an array of flash memory units each having a V-shaped gate structure according to this invention.

FIG. 5 is an equivalent circuit diagram of an array of flash memory units each having a V-shaped gate structure according to this invention. In FIG. 5, the circled flash memory unit A has the same configuration as the enclosed flash memory unit A shown in FIG. 1. The flash memory of this invention inputs data into a flash memory unit by channel hot electron injection (CHEI) while erasing data from the flash memory unit by Fowler-Nordheim (FN) tunneling. The following is a brief description of the mode of operation of an N-type flash memory.

To program data into a selected flash memory unit, a positive voltage such as Vcc is applied to word line WL2 and a higher positive voltage such as 2Vcc is applied to bit line BL1. A zero voltage (ground voltage) is applied to other non-selected word lines WL1 and WL3, bit line BL2 and source lines SL1, SL2 and SL3 respectively. Through channel hot electron injection, electric charges are injected into the floating gate. Depending on whether electrons are injected into the floating gate or not, the respective flash memory cell are programmed.

Since electric charges are injected into the floating gate by hot electron injection, electrons coming from the source terminal will speed across to the drain terminal and the floating gate. Electrons propelled from the source terminal are accelerated along the channel. With the aid of the corner region (indicated by label 160 in FIG. 2F) on the V-shaped wedge section, electrons jump from the neighborhood of the corner region 160 straight into the floating gate 134. Hence, the injection probability is greatly increased, thereby saving programming energy.

To erase data from a selected flash memory unit, a negative voltage is applied to the word line WL2 and a positive voltage is applied to the source line SL2. A zero voltage is applied to other non-selected word lines WL1 and WL3, source lines SL1 and SL3, and bit lines BL1 and BL2. Through a Fowler-Nordheim (FN) tunneling effect, electrons trapped inside the floating gate are pulled out.

While FN tunneling is occurring to erase data within a flash memory unit, two channels are formed on each side of the V-shaped structure of this invention. Since a conventional flash memory cell normally has just one channel, speed of erasure is doubled.

To read data from a selected flash memory unit, a positive voltage such as Vcc is applied to the word line and a smaller positive voltage such as 0.2Vcc to 0.02Vcc is applied to the bit line. A zero voltage is applied to the source line. Through such an arrangement, data inside the flash memory unit can be readily read out. Because each flash memory unit has two channels, reading current is roughly double that of a conventional unit. Hence, reading stability for this type of flash memory unit is increased.

In summary, the advantages of the invention include:

(1) By forming the word line stack gate over the buried source line, layout area required by each memory cell is reduced. Hence, overall level of integration of the flash memory is increased.

(2) By forming a V-shaped word line gate structure, overlapping area between the floating gate and the control gate is increased, thereby increasing coupling capacitance and lowering operating voltage.

(3) Each flash memory cell actually has two channels. Therefore, efficiency of memory erase is increased. In addition, since reading current is almost doubled, reading stability is also improved considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a flash memory having a V-shaped gate structure, comprising:

providing a substrate;

forming a mask layer over the substrate;

forming a buried source line in the substrate by implanting dopants into the substrate while using the mask layer as a mask;

removing a portion of the substrate while using the mask layer as an etching mask to form a V-shaped trench that exposes the buried source line;

removing the mask layer;

sequentially depositing oxide material and gate material to form a conformal tunnel oxide layer and a floating gate layer over the substrate;

patterning the tunnel oxide layer and the floating gate layer to form a line running perpendicular to the buried source line;

sequentially depositing dielectric material and control gate material to form a conformal dielectric layer and a control gate layer;

patterning the tunnel oxide layer, the floating gate layer, the dielectric layer and the control gate layer to form a V-shaped word line stack gate above the V-shaped trench that runs parallel to the buried source line;

forming a common drain terminal in the substrate on each side of the V-shaped stack gate;

forming an insulation layer over the substrate; and forming a bit line over the insulation layer and a conductive plug in the insulation layer for electrically connecting the common drain terminal and the bit line.

2. The method of claim 1, wherein the step of forming the mask layer includes forming a hard mask layer and forming mask spacers on sidewalls of a hard mask layer.

3. The method of claim 2, wherein the step of forming the hard mask layer and the mask spacers includes depositing silicon nitride.

4. The method of claim 2, wherein the step of forming the hard mask layer and the mask spacers further includes forming an oxide buffer layer between the substrate and the hard mask layer, between the substrate and the mask spacers and between the hard mask layer and the mask spacers.

5. The method of claim 1, wherein the step of forming the buried source line includes implanting ions.

6. The method of claim 1, wherein the step of forming the V-shaped trench includes conducting anisotropic dry etching.

7. The method of claim 1, wherein the step of forming the dielectric layer includes depositing silicon oxide, silicon nitride and silicon oxide to form a composite stack.

8. The method of claim 1, wherein the step of forming the common drain terminal includes implanting ions.

9. The method of claim 1, wherein the step of forming the insulation layer includes depositing silicon oxide.

10. The method of claim 1, wherein the step of forming the bit line and the conductive plug includes depositing tungsten.

11. A method of forming a flash memory structure with a V-shaped stack gate above a substrate, comprising the steps of:

forming a mask layer over the substrate;

doping the substrate while using the mask layer as a mask to form a buried source line;

removing a portion of the substrate while using the mask layer as an etching mask to form a V-shaped trench that exposes the source line;

removing the mask layer;

sequentially depositing oxide material and gate material to form a conformal tunnel oxide layer and a floating gate layer over the substrate;

patterning the tunnel oxide layer and the floating gate layer to form a line running perpendicular to the buried source line; dielectric layer and a control gate layer;

patterning the tunnel oxide layer, the floating gate layer, the dielectric layer and the control gate layer to form a V-shaped word line stack gate over the V-shaped trench that runs parallel to the buried source line; and forming a common drain terminal in the substrate on each side of the V-shaped word line stack gate.

12. The method of claim 11, wherein the step of forming the mask layer includes forming a hard mask layer and forming mask spacers on sidewalls of the hard mask layer.

13. The method of claim 11, wherein the step of forming the hard mask layer and the mask spacers includes depositing silicon nitride.

14. The method of claim 11, wherein the step of forming the buried source line includes implanting ions.

15. The method of claim 11, wherein the step of forming the V-shaped trench includes conducting anisotropic dry etching.

16. The method of claim 11, wherein the step of removing the mask layer includes wet etching.

17. The method of claim 12, wherein the step of forming the dielectric layer includes depositing silicon oxide, silicon nitride and silicon oxide to form a composite stack.

18. The method of claim 11, wherein the step of forming the common drain terminal includes implanting ions.

* * * * *